US007529279B2

(12) United States Patent
Reid

(10) Patent No.: US 7,529,279 B2
(45) Date of Patent: May 5, 2009

(54) TUNEABLE LASER

(75) Inventor: Douglas Charles John Reid, Rugby (GB)

(73) Assignee: Bookham Technology, PLC, Towcester (GB)

( * ) Notice: Subject to any disclaimer, the term of this patent is extended or adjusted under 35 U.S.C. 154(b) by 29 days.

(21) Appl. No.: 10/485,787

(22) PCT Filed: Aug. 2, 2002

(86) PCT No.: PCT/GB02/03563

§ 371 (c)(1),
(2), (4) Date: Sep. 1, 2004

(87) PCT Pub. No.: WO03/015230

PCT Pub. Date: Feb. 20, 2003

(65) Prior Publication Data

US 2005/0053102 A1    Mar. 10, 2005

(30) Foreign Application Priority Data

Aug. 3, 2001    (GB) ................................ 0118971.1

(51) Int. Cl.
*H01S 3/10*    (2006.01)
(52) U.S. Cl. ............................. 372/20; 372/96; 372/102
(58) Field of Classification Search .................. 372/20, 372/96, 102
See application file for complete search history.

(56) References Cited

U.S. PATENT DOCUMENTS

| 4,885,753 | A | * | 12/1989 | Okai et al. | ............... | 372/45.01 |
|---|---|---|---|---|---|---|
| 5,379,318 | A | | 1/1995 | Weber | | |
| 5,748,660 | A | | 5/1998 | Delorme et al. | | |
| 5,838,714 | A | | 11/1998 | Delorme | | |
| 5,905,745 | A | | 5/1999 | Grubb et al. | | |
| 2001/0005391 | A1 | * | 6/2001 | Sakata | ......................... | 372/43 |
| 2002/0048300 | A1 | * | 4/2002 | Tsukiji et al. | .................. | 372/43 |

FOREIGN PATENT DOCUMENTS

| EP | 559192 B1 | 6/1999 |
|---|---|---|
| EP | 997764 A1 | 5/2000 |

OTHER PUBLICATIONS

Kim et al. "Time-domain large-signal analysis of widely tunable laser diodes with periodically sampled and chirped gratings." *IEEE Photonics Letters* 1998; 10(1):39-41.

Tohmori et al. "Broad-range wavelength-tunable superstructure grating (SSG) DBR lasers." *IEEE J. Quantum Elec.* 1993;29(6):1817-1823.

* cited by examiner

*Primary Examiner*—Minsun Harvey
*Assistant Examiner*—Tod T Van Roy
(74) *Attorney, Agent, or Firm*—Lahive & Cockfield, LLP; Anthony A. Laurentano

(57) ABSTRACT

A tuneable laser includes a gain section (50) bounded by two mirrors (51 and 52) at least one mirror being a chirp grating. At least one of the mirrors includes a plurality of selectable electrodes (59 to 65) to enable the grating to be selectively activated to produce a selective reflection at a predetermined wavelength.

19 Claims, 19 Drawing Sheets

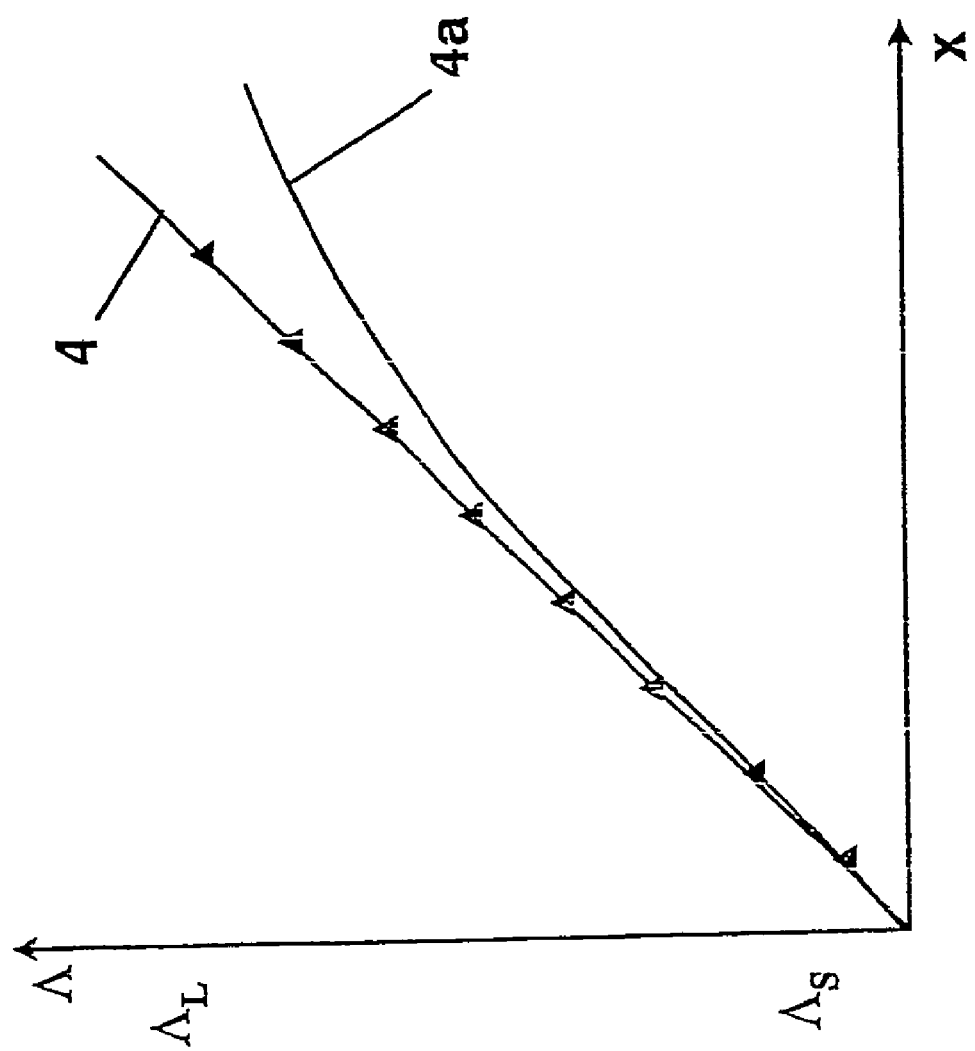

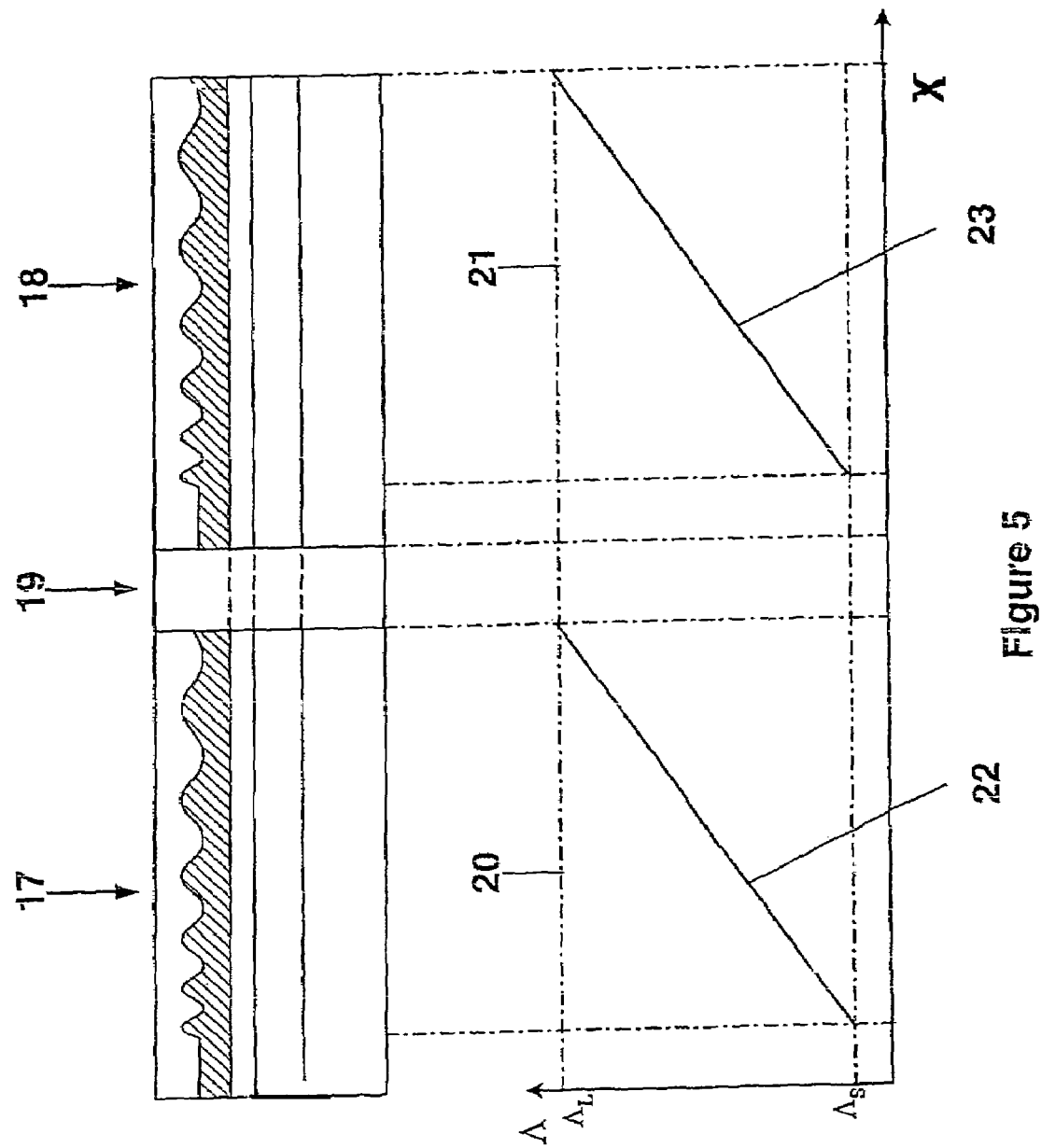

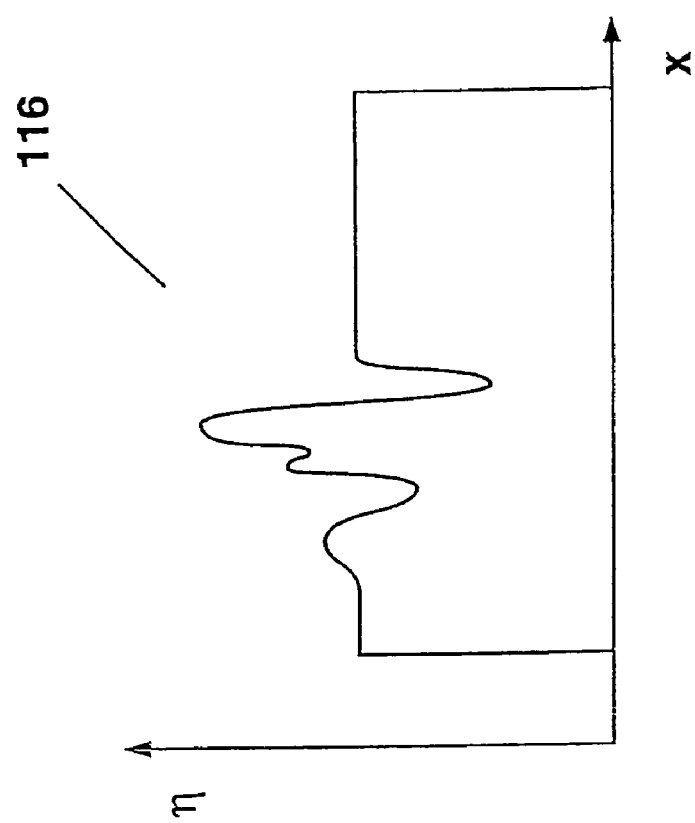
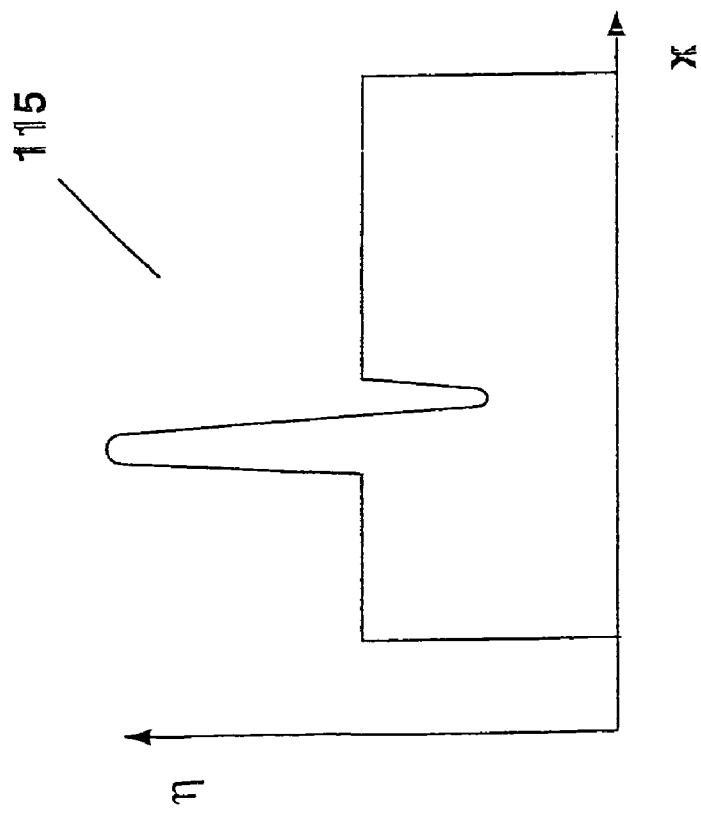
Figure 14

TUNEABLE LASER

RELATED APPLICATIONS

This application is a 35 U.S.C. 371 national stage filing of International Application No. PCT/GB02/03563, filed 2 Aug. 2002, which claims priority to Great Britain Patent Application No. 0118971.1 filed on 3 Aug. 2001 in Great Britain. The contents of the aforementioned applications are hereby incorporated by reference.

This invention relates to tuneable lasers and has particular, but not necessarily exclusive, reference to tuneable lasers for use in telecommunications systems operating in the C-band, namely within the band of 1530 to 1570 nm.

BACKGROUND OF THE INVENTION

In this specification the term "light" will be used in the sense that it is used in optical systems to mean not just visible light but also electromagnetic radiation having a wavelength between 1000 nanometers (nm) and 3000 nm.

Narrowband lasers are important for a number of applications in optical telecommunications and signal processing applications. These include multiple channel optical telecommunications networks using wavelength division multiplexing (WDM). Such networks can provide advanced features, such as wavelength routing, wavelength conversion, adding and dropping of channels and wavelength manipulation in much the same way as in time slot manipulation in time division multiplexed systems. Many of these systems operate in the C-band in the range 1530 to 1570 nm.

Tuneable lasers for use in such optical communications systems, particularly in connection with the WDM telecommunication systems, are known. A known tuneable system comprises a plurality of individually wavelength distributed Bragg reflectors (DBR) lasers, which can be individually selected, or by a wide tuning range tuneable laser that can be electronically driven to provide the wavelength required. Limited tuning range tuneable lasers that rely upon thermal effects for tuning are also known.

U.S. Pat. No. 4,896,325 discloses a wavelength tuneable laser having sampled gratings at the front and rear of its gain region. The gratings produce slightly different reflection combs which provide feedback into the device. The gratings can be current tuned in wavelength with respect to each other. Co-incidence of a maximum from each of the front and rear gratings is referred to as a supermode. To switch the device between supermodes requires a small incremental electrical current into one of the gratings to cause a different pair of maxima to coincide in the manner of a vernier. By applying electrical currents to the two gratings so that the corresponding maxima track, continuous tuning within a supermode can be achieved. In practice the reflection spectrum of the known sampled grating structures have a Sinc squared envelope which limits the total optical bandwidth over which the laser can reliably operate as a single mode device.

In summary, for a given set of drive currents in the front and rear grating sections, there is a simultaneous correspondence in reflection peak at only one wavelength, as a consequence of which the device lases at that wavelength. To change that wavelength a different current is applied to the front and rear gratings. Thus the front and rear gratings operate in a vernier mode, in which the wavelengths of correspondence determine a supermode wavelength.

The sampled grating DBR does not have a constant optical cavity length as it goes from one supermode to another, which can result in mode hopping if great care is not taken to avoid it.

BRIEF SUMMARY OF THE INVENTION

By the present invention there is provided a monolithic tuneable laser comprising an active section bounded at one end by a first mirror and at the other end by a second mirror, characterised in that each of the mirrors is in the form of a chirp grating, and in that at least one of the mirrors has a plurality of selectable electrodes to enable the grating to be selectively activated to produce a selective reflection at a predetermined wavelength.

The gratings may be located in a material having a refractive index variable in response by the passage of a current therethrough and the grating may be activated at the specific wavelength by the variation in a local region of the refractive index.

The wavelength position of the specific reflection may be altered by varying the refractive index of at least that region of tie grating and also the portion of the grating between the region and the gain section.

One of the gratings is a front grating and the other a rear grating, with the selectable electrodes being located on either the rear or the front grating, or both. The pitch characteristics of the front and rear chirp gratings, being the grating pitch against distance along the grating, may be substantially identical and the chirp gratings may be linear. In a preferred embodiment having minimum or no mode hopping during timing and when used at different wavelengths, the two chirp profiles have different chirp characteristics so that the optical cavity length is constant or substantially constant at different wavelengths.

The reflectivity of the rear mirror may be greater then the reflectivity of the front mirror.

The front and rear mirrors may be formed by electron beam writing of the grating patterns and the mark space ratio of the rear mirror may be substantially unity and the mark space ratio of the front mirror may be substantially different to unity.

The reflectivity of the rear mirror is typically 50% and the reflectivity of the front mirror is typically 30%.

The pitch spacings of the rear mirror chirp may be at its lowest adjacent the gain section and the pitch spacings of the front mirror may be at its highest adjacent the gain section.

There may be provided a phase change section between the gain section and the rear grating.

One or more of the tuning electrodes within the optical cavity may be utilised as a phase control means to reduce or eliminate mode hopping.

Light power may be coupled out from both ends of the laser, and both gratings may be substantially identical.

The composition of the mirror sections typically is formed of Group III-V semiconductor layers of different refractive index.

The present invention also provides a method of operating a laser in which the rear grating has a plurality of selectable electrodes and in which the selection of a wavelength occurs by passing current through one of the electrodes to reduce the refractive index of the portion of the chirp grating affected by the electrode in which those electrodes capable of reducing the refractive index of the portion of the chirp effective at a shorter wavelength are also actuated to prevent the formation of a distorted reflection peak.

BRIEF DESCRIPTION OF THE DRAWINGS

FIGS. 1a and 1b show the concept of a chirp grating,

FIG. 5 shows the chirp characteristics of the laser of FIG. 4

FIG. 6b shows the reflectivity of the gratings of FIG. 6a

FIG. 14 is a graph of reflectivity against distance.

DESCRIPTION OF THE PREFERRED EMBODIMENTS OF THE INVENTION

The wavelengths of interest referred to above, for example the C-band wavelengths of 1530 to 1570 nm are the wavelengths of light in free space. When such light passes through a medium, of refractive index $n_{eff}$, the wavelength of the light changes. The actual wavelength of the light within that medium which will be referred to herein as $\lambda'$, is the wavelength $\lambda$ divided by the value for the refractive index $n_{eff}$. In other words $$\lambda' = \lambda/n_{eff} \tag{1}$$

where $n_{eff}$ is the effective refractive index of the medium as seen by the propagating light.

It so happens that the glass (silica) fibres, which are commonly used in telecommunicatons systems, have low loss regions at about 1100 nm 1300 nm and 1500 nm. These regions are about 100 nm wide and consequently much work is done on producing lasers that produce light in the low loss regions. The same is true for the tuneable laser of the present invention. The specific examples of the invention are designed to work in the C-Band, but the invention could be used for other wavelengths if required and if new types of fibre optical cables become available.

Figure 1A:
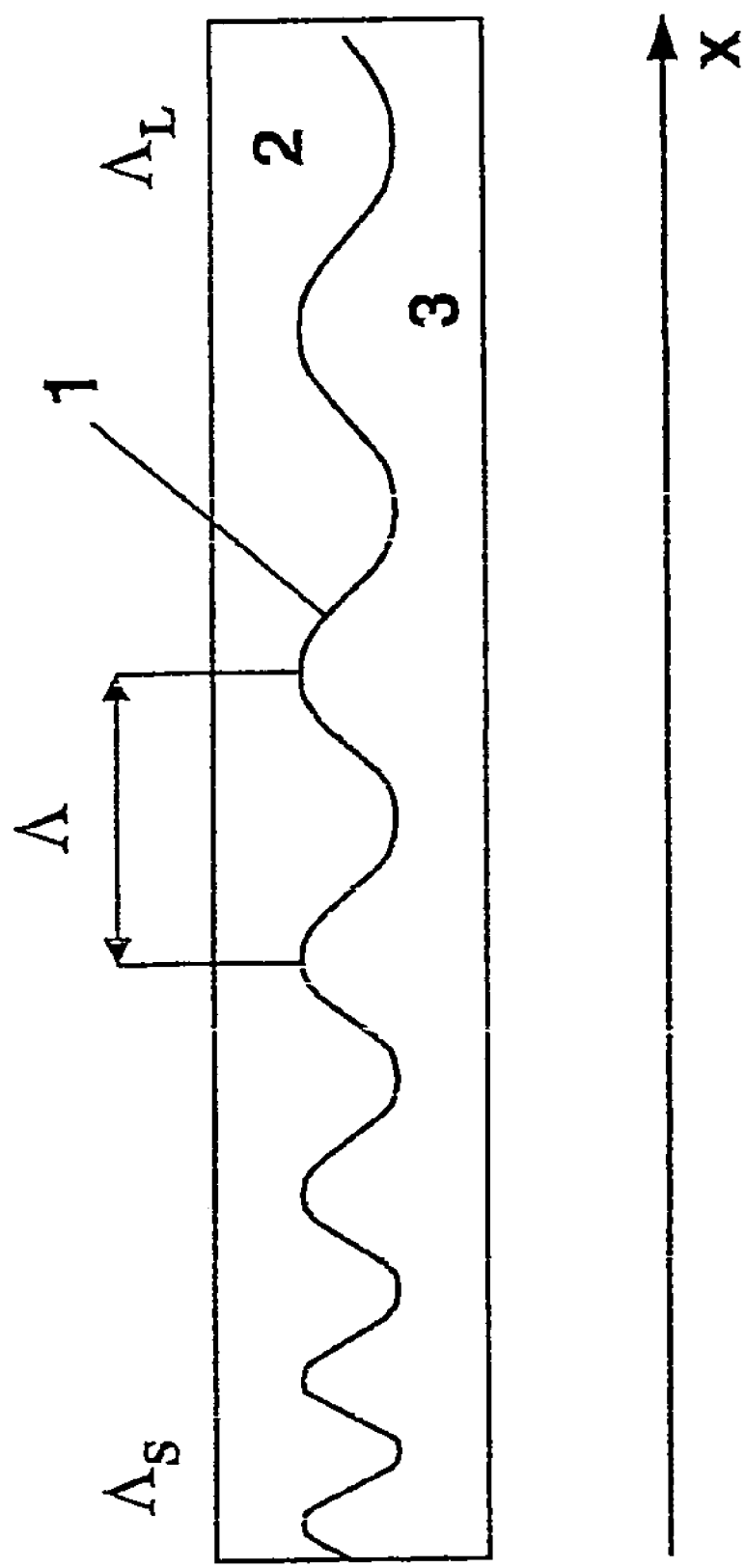

Referring to FIG. 1a, this shows the nature of a chirp grating, as the term is used in the specification and as it is to be understood herein. The chirp grating is a form of Bragg grating which has a substantially continuous variation in the wavelength at which it reflects light along its length. It is thus distinguished from a normal DBR, which reflects at a single wavelength, and also from a sampled grating DBR which reflects at a plurality of discrete wavelengths.

A chirp grating is formed at the interface between two materials of different refractive index and can be represented graphically as a sinusoidal shaped waveform, or as a castellated form. The physical shape of the grating is dependent upon the etching technique employed and may result in a castellated form, particularly when a dry etching process is used to produce the grating, e.g. reactive ion etching.

As shown in FIG. 1a, the grating is formed as an interface 1 between the upper layer of material 2 of a low refractive index and a lower layer 3 of a higher refractive index. The pitch Λ of the grating is gradually increased along the length of the grating from $\Lambda_s$ at the short pitch end of the chirp grating to $\Lambda_L$ at the long pitch end of the grating. In FIG. 1a the increase in pitch is deliberately exaggerated to demonstrate what is happening. In practise, for typical telecommunications bands, the increase in pitch length over the whole of the grating will be small, namely about 2.5%. This means that at the short end the grating reflects light of a wavelength corresponding to 1530 nm and at the long end the grating reflects light at a wavelength corresponding to 1570 nm. Thus there is a 40 nm variation in the reflection wavelength over the length of the grating, which is about 2.5% of the average wavelength of 1550 nm.

The refractive index n of the material used in the production of the chirp grating through which the majority of the light passes is quaternary material (InGaAsP) and the refractive index n of the material varies, as stated above, with the wavelength of light passing through the material. Typically n at 1570 nm is 3.33, at 1550 nm n is 3.38 and at 1530 nm n is 3.43. Thus n decreases by about 3% from 1530 nm to 1570 nm.

In FIG. 1b, there is a graph showing how the pitch of the grating varies along its length, with the pitch, Λ, in the vertical axis and the length of the grating x on the horizontal axis.

It will be appreciated that the pitch values, Λ, along the length of the grating can be plotted directly against the length and a line 4 is generated. The line 4 can be straight or can be curved depending on how the pitch is varied along the length of the grating. If the increase in grating pitch is at a constant rate, the line is straight and the grating is called a linear chirp grating. If the increase in grating pitch along the grating is uniform, in other words in the direction of increasing Λ, each Λ is a certain small constant amount greater in length than the one before it, then in this case line 4 will not be linear but will curve downwards as the line increasingly goes to the right as shown in the drawing at 4a.

Figure 2:
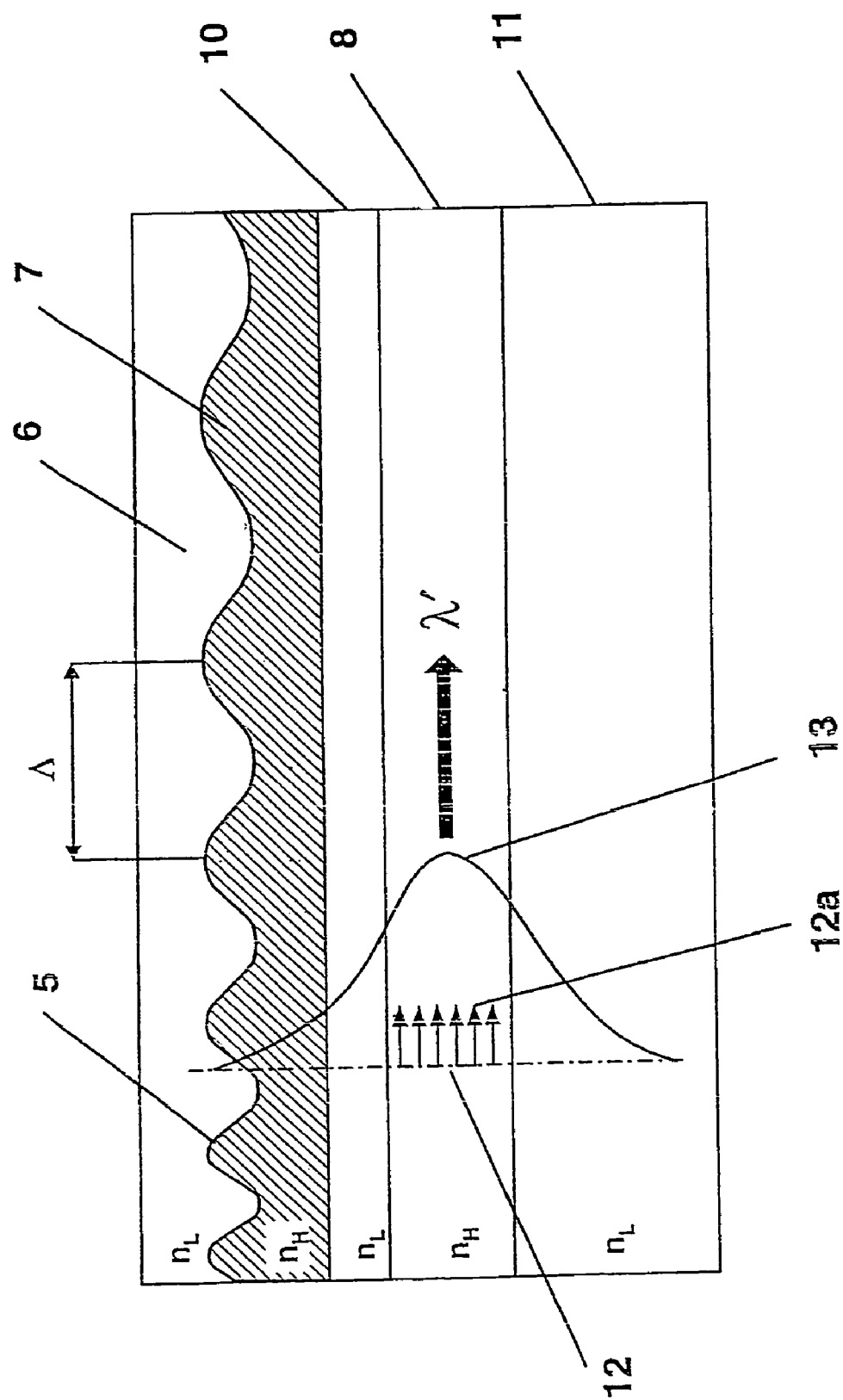
FIG. 2 shows a wave front passing along a chirp grating.

Referring to FIG. 2, this demonstrates the effect of light passing along a chirp grating. Again the grating is shown as a sinusoidal interface 5 between an upper layer 6 of a lower refractive index and a lower layer 7 of higher refractive index. The waveguide of the assembly of high refractive index is shown at 8, separated from the lower layer 7 of the chirp grating by an intermediate layer 10 of low refractive index. Underneath the waveguide 8 is a low refractive index substrate 11. The two layers 10 and 11 serve to contain the light passing through the waveguide 8. Superimposed on the layer structure is a graphical representation of the wave front of the light passing through from left to right as at 12 in the direction of the arrows 12a. Trace 13 is an indication of the intensity of the light in the layers of the assembly with the higher intensity levels to the right of the figure. It can be seen that most of the light passes through the waveguide 8 of high refractive index.

As shown in FIG. 2, the light passes not only through the waveguide 8 but also through the layer 7 forming the lower layer of the chirp grating. If the light should happen to have a wavelength $\lambda'$ which is twice the grating pitch Λ then that light will be reflected back i.e. if $\lambda'=2\Lambda$ then that wavelength of light will be reflected. Thus the chirp grating as a whole will reflect light in the range $\lambda'_s=2\Lambda_s$ to $\lambda'_L=2\Lambda_L$ where $\Lambda_s$ is the shortest grating pitch and $\Lambda_L$ is the longest grating pitch. Light of wavelengths outside of this range will not be reflected back along the waveguide.

Figure 3:
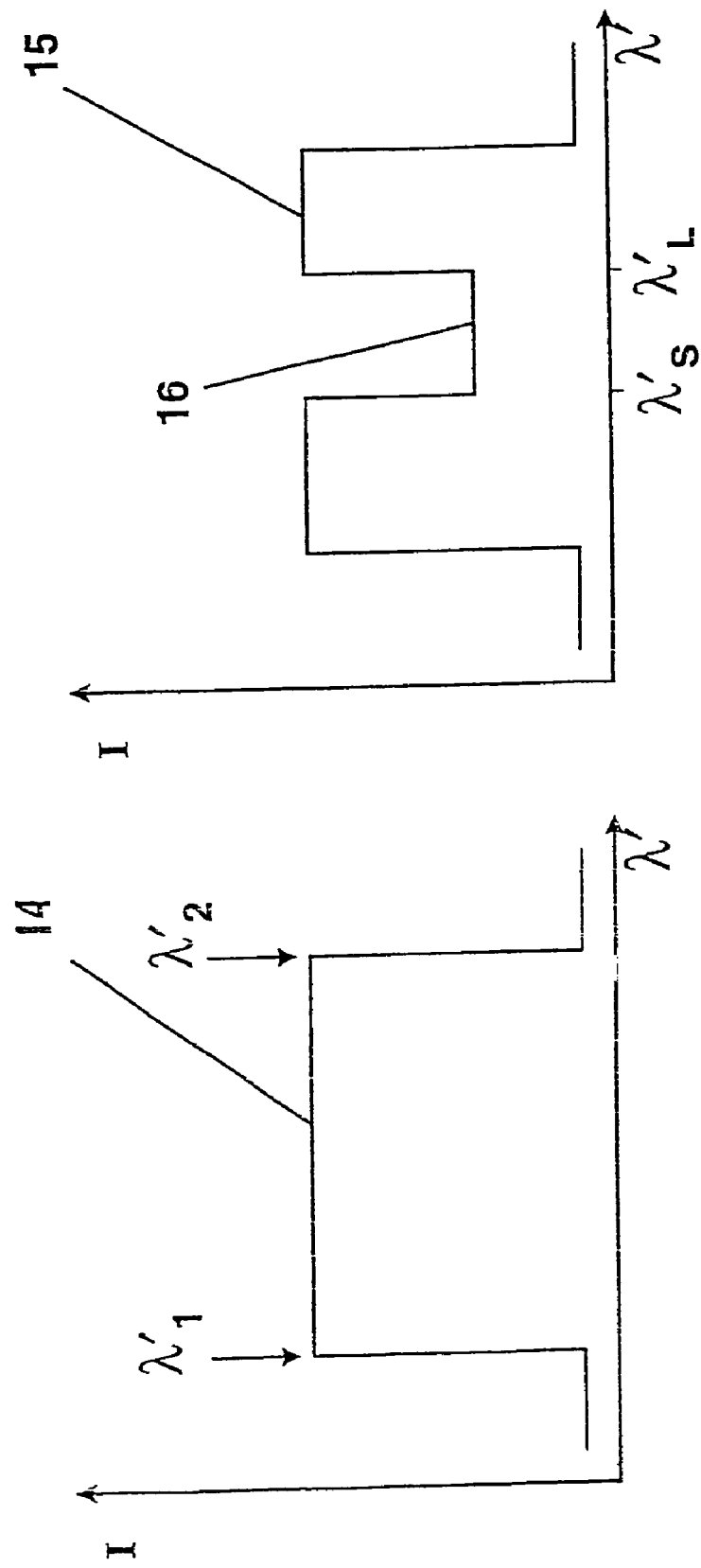
FIG. 3 is a pair of box diagrams of intensity against wavelength.

This can be represented diagrammatically as in FIG. 3, which are box diagrams of intensity of light, I, in the vertical axis and wavelength, $\lambda'$, in the horizontal axis. If a box of light consisting of a plurality of wavelengths is admitted into the grating as shown at 14 on the left hand side of the drawing, the envelope is complete and represents all of the wavelengths between $\lambda'_1$ and $\lambda'_2$, which are widely, separated wavelengths. However as the chirp grating reflects certain of the wavelengths, for example between $\lambda'_s$ and $\lambda'_L$, the emerging box of wavelengths 15 has a gap 16 which corresponds to those wavelengths between $\lambda'_s$ and $\lambda'_L$ reflected by the chirp grating.

Figure 4:
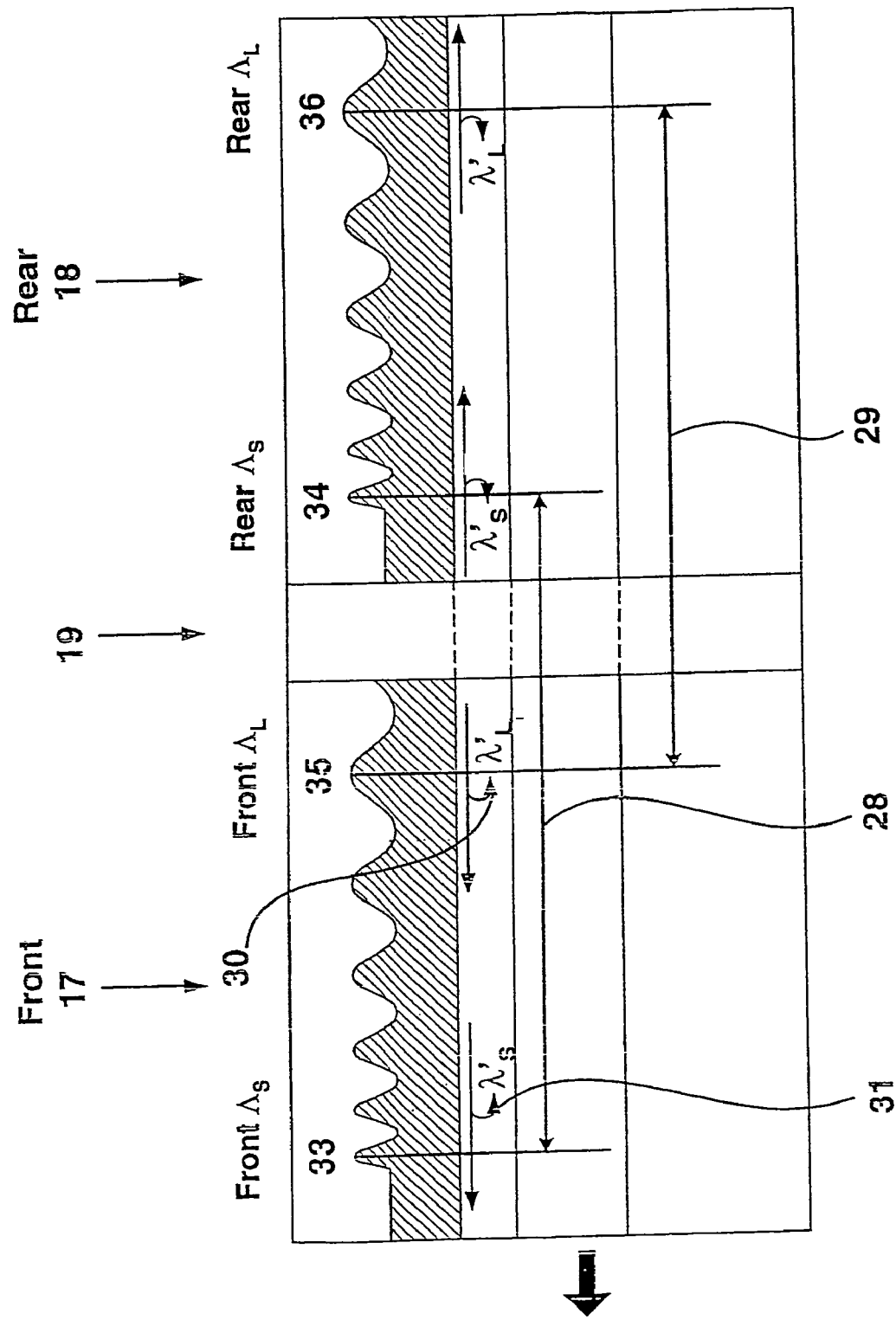
FIG. 4 is laser assembly with two chirp gratings.

As illustrated in FIG. 4, for the purposes of explanation, two chirp gratings shown generally by 17 and 18 can be created on either side of a gain section 19. Initially, for the ease of understanding of the invention, the gain section will be ignored. In FIG. 5, the two chirp gratings 17 and 18 are shown superimposed on the pitch vs distance plots 20 and 21, which form the lower portion of FIG. 5. These pitch vs distance plots show pitch $\Lambda$ in the vertical axis and distance x along the grating in the horizontal axis. The grating 17 will be termed the front grating and the grating 18 will be termed the rear grating. The shape of the graph of pitch spacing from $\Lambda_S$ to $\Lambda_L$ vs. distance as represented by trace 22 for grating 17 is the same as that for grating 18 as shown by trace 23.

Figure 6A:
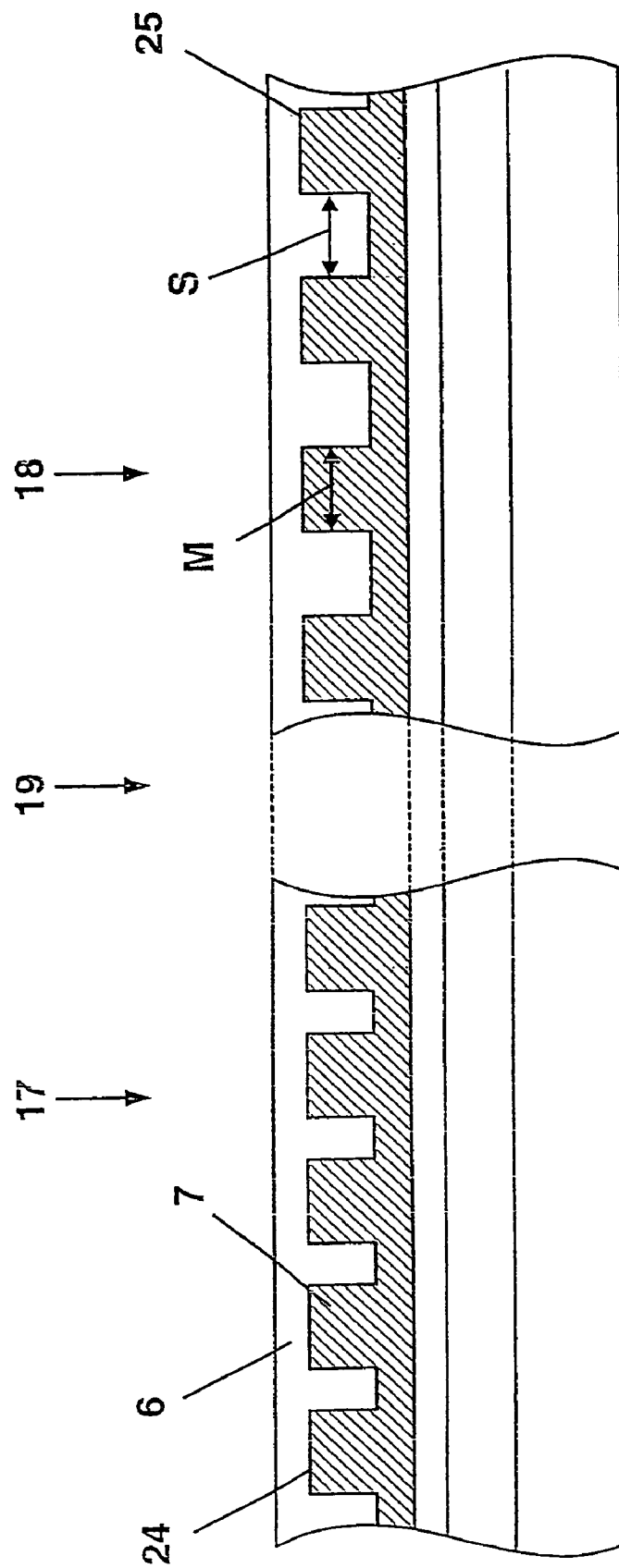
FIG. 6a shows the laser of FIG. 4 with castellated gratings

As mentioned above, the interface between the materials of different refractive index which goes to make up the chirp grating, can be produced in the form of castellations, and are illustrated in FIG. 6a at 24 and 25. The preferred method of producing the castellations is to produce layer 7 and to etch grooves into the layer and then to grow layer 6 on top of the layer 7 containing the grooves. The width of the grooves is then conventionally referred to as a space, S, and the distance between the grooves is referred to as a mark, M. The width of the mark M and the spacing S can be varied, so as to alter the mark/space ratio (M/S ratio). The most reflective form of the grating is when M/S=1, and as the ratio of M/S varies away from 1 the grating becomes less reflective. The rear grating has a mark/space ratio of 1 whereas the front grating has a mark/space ratio greater or less than 1.

Figure 6B:
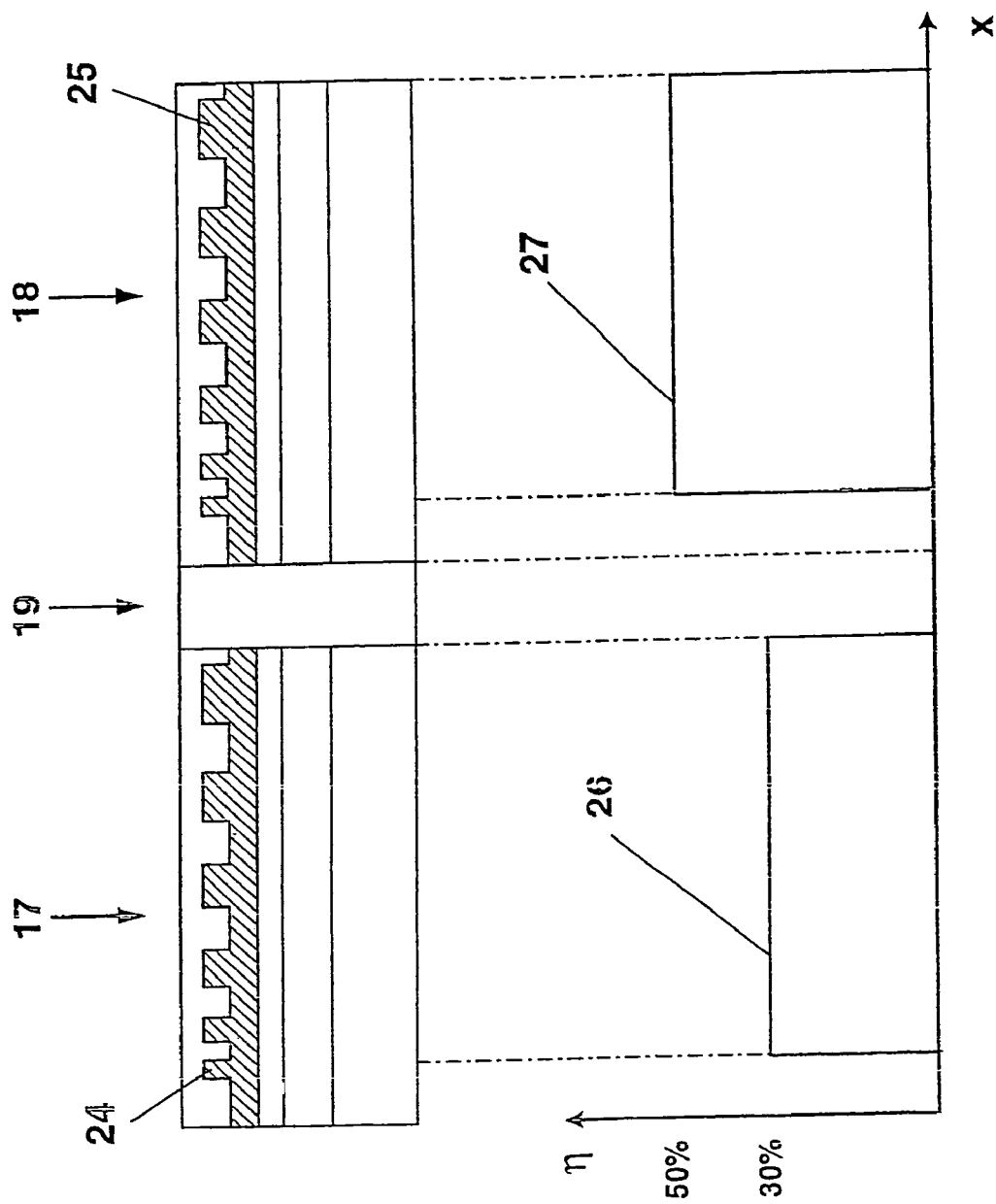

The effect of this difference is shown schematically in the lowest portion of FIG. 6b, which is a graph of reflection $\eta$ against distance x, and it can be seen that the front chirp has a reflection coefficient of about 30% and the rear grating has a reflection coefficient of about 50%. This is shown by the traces 26 for the front grating and 27 for the rear grating.

The front and rear chirp gratings can be either of the same chirp profile, or have different profiles, for reasons that are set out in a later part of the specification. If the chirp gratings have the same profile then a phase section functionality is required. In the circumstance where the front and rear chirps have the same chirp profile then this means that the slopes 22 and 23 are identical, as shown in FIG. 5. The distance 28 between two corresponding positions 33, 34 at the short ends of the gratings, as shown in FIG. 4, will be the same as the distance 29 between two corresponding positions 35, 36 at the long ends of the gratings. The significance of this will be seen below.

The effect of placing a gain medium in the region 19 is that light can be generated in that region and this generated light will initially pass outwards in both directions from the centre.

Light which is of a longer wavelength than that which can be reflected by the grating at any point does not in effect "see" the grating and is unaffected by it. Thus light of a wavelength longer than $\lambda'_L$ will be substantially unaffected by the grating but be partially absorbed by the waveguide, and light of shorter wavelengths will be variously affected. With reference to FIG. 4, light having wavelengths between $\lambda'_L$ and $\lambda'_S$ passing to the left of the gain section in the direction of the front grating will be reflected back as at 30 to 31.

Light of the longer wavelengths $\lambda'_L$ will be reflected immediately by the gratings of pitch front $\Lambda_L$, but the light of the shorter wavelengths $\lambda'_S$ is partially attenuated by having to pass through the longer pitch gratings on its way to reach the front grating of pitch $\Lambda_S$ and be reflected. That light then has to pass back through the longer pitch gratings and is again partially attenuated. Thus from the front grating as a whole, the reflected light will have the longer wavelengths predominating, as the shorter wavelengths are more attenuated by the grating.

The light passing to the right into the rear grating will also be reflected back but as the shorter wavelengths are reflected first, and do not have to pass through the longer wavelength sections of the grating, they are not attenuated to the same extent as light of the same wavelengths passing through the front grating. Again the light of longer wavelengths, which is reflected by the rear gratings of pitch $\Lambda_L$, does not "see" the shorter pitch gratings. Thus, the light at all wavelengths is reflected more uniformly by the rear grating than by the front grating.

The asymmetric effect of attenuation on the reflected light leads to preferred directions for the passage of light through the front and rear chirps. This is illustrated in FIGS. 7 and 8.

Figure 7:
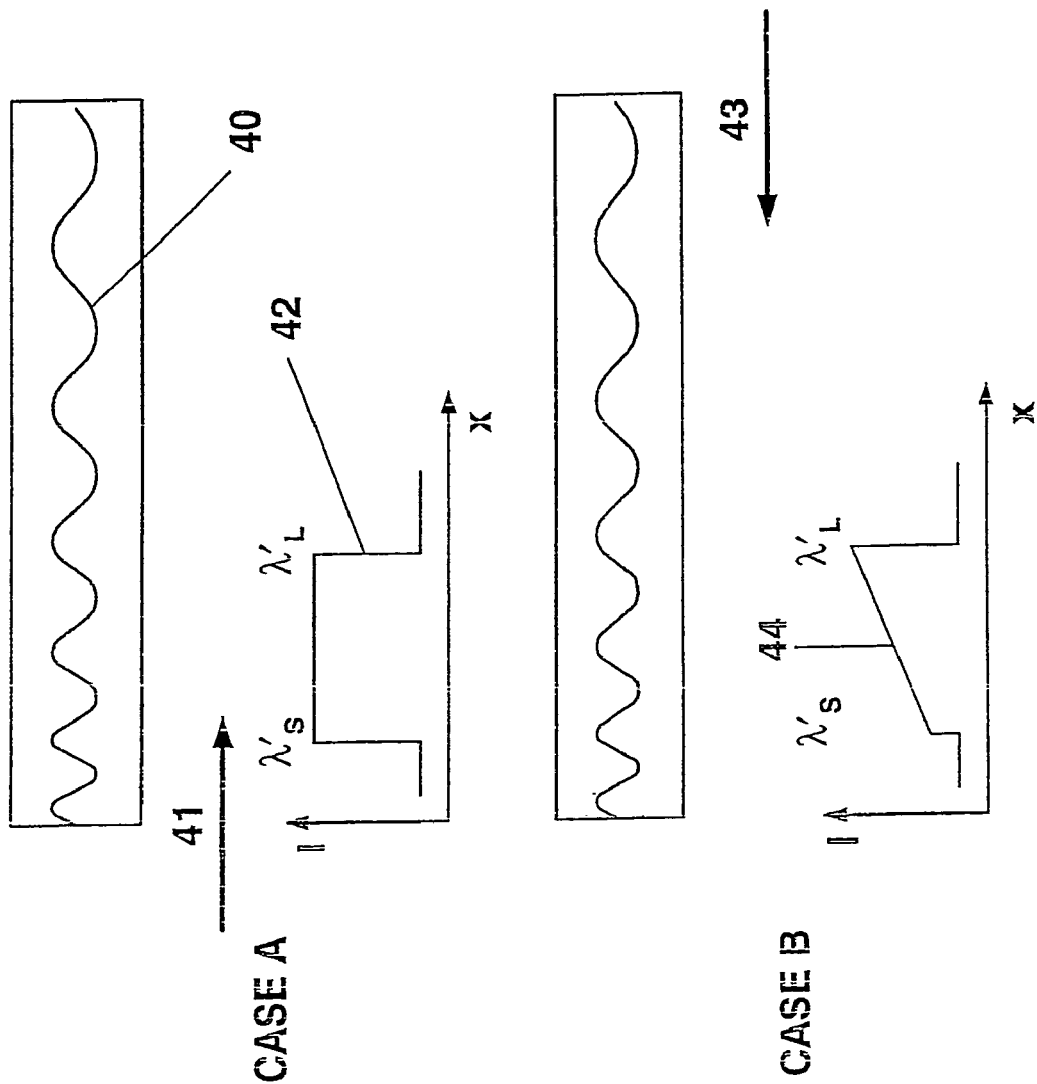
FIGS. 7 and 8 illustrate the effect of light passing in both directions along strong and weak gratings.

Ignoring waveguide losses FIG. 7 illustrates what happens with a higher strength reflecting grating. In the upper two sections of the drawing labelled Case A the reflection of a box of wavelengths passing along a chirp grating 40, from shorter to longer pitch in the direction 41, is illustrated at 42 in the box diagram of light intensity I vs. distance x. The reflection is substantially the same at the shorter wavelengths $\lambda'_S$ as at the longer wavelengths $\lambda'_L$. However if the light is passed through the same grating 40 in the other direction, as in the direction of arrow 43 as shown labelled Case B, then the short wavelengths $\lambda'_S$ are reflected to a far lesser extent than the longer wavelengths $\lambda'_L$. This is as shown in the lower box diagram at 44. It can be seen that the shorter wavelengths are strongly attenuated compared to the longer wavelengths.

Figure 8:
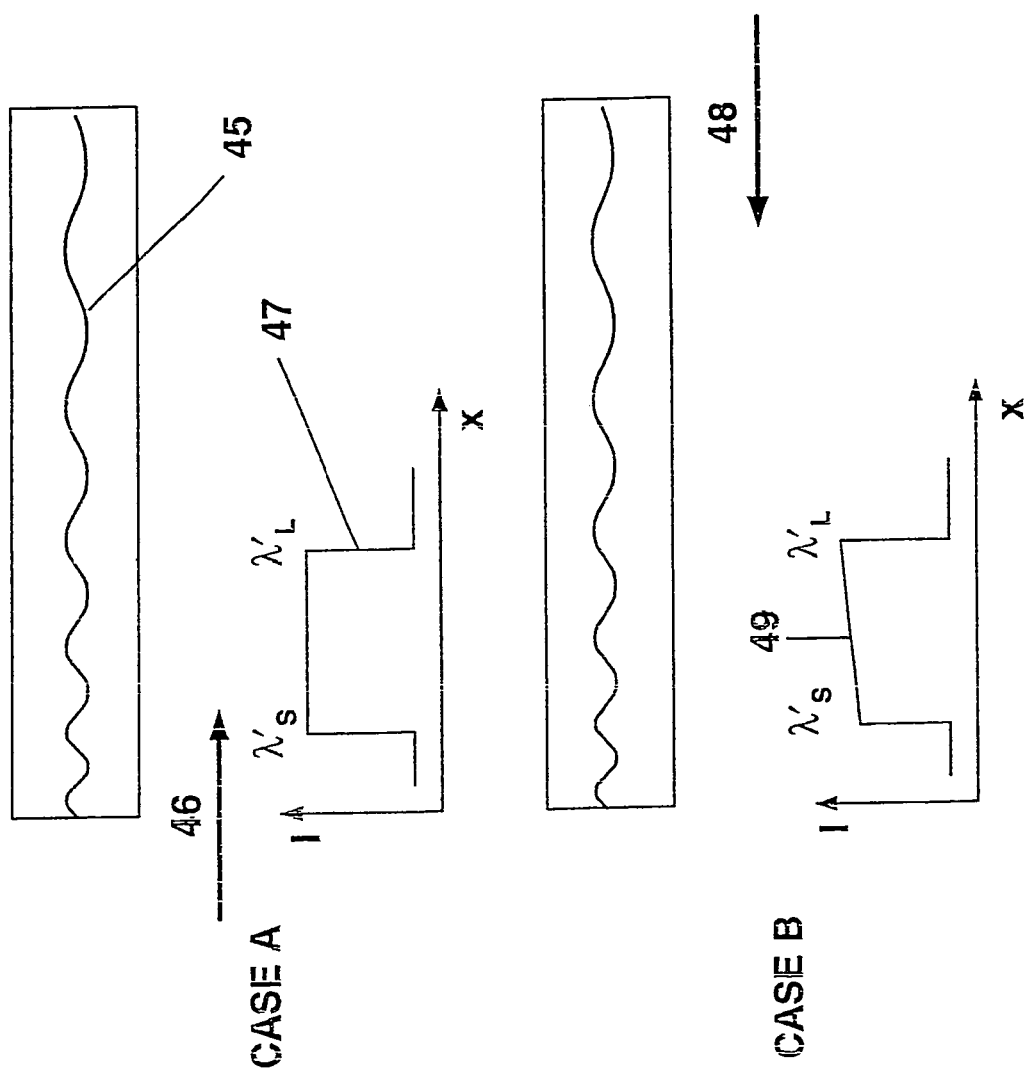

By comparison the reflection effects for a lower strength reflecting grating 45 are shown in FIG. 8. Again the light passing in the direction 46 from the shorter pitch to the longer and labelled Case A is reflected substantially uniformly across all the wavelengths as shown at 47 in the box diagram of light intensity I vs. distance x. However the shorter wavelengths of light passing in the opposite direction 48, and labelled Case B, are attenuated to a lesser extent compared to the grating of stronger reflectivity, as shown in the box diagram by line 49.

As a consequence in a preferred embodiment the rear strong mirror has $\Lambda_S$ adjacent the gain section and the front mirror has $\Lambda_L$ adjacent the gain section.

Figure 9:
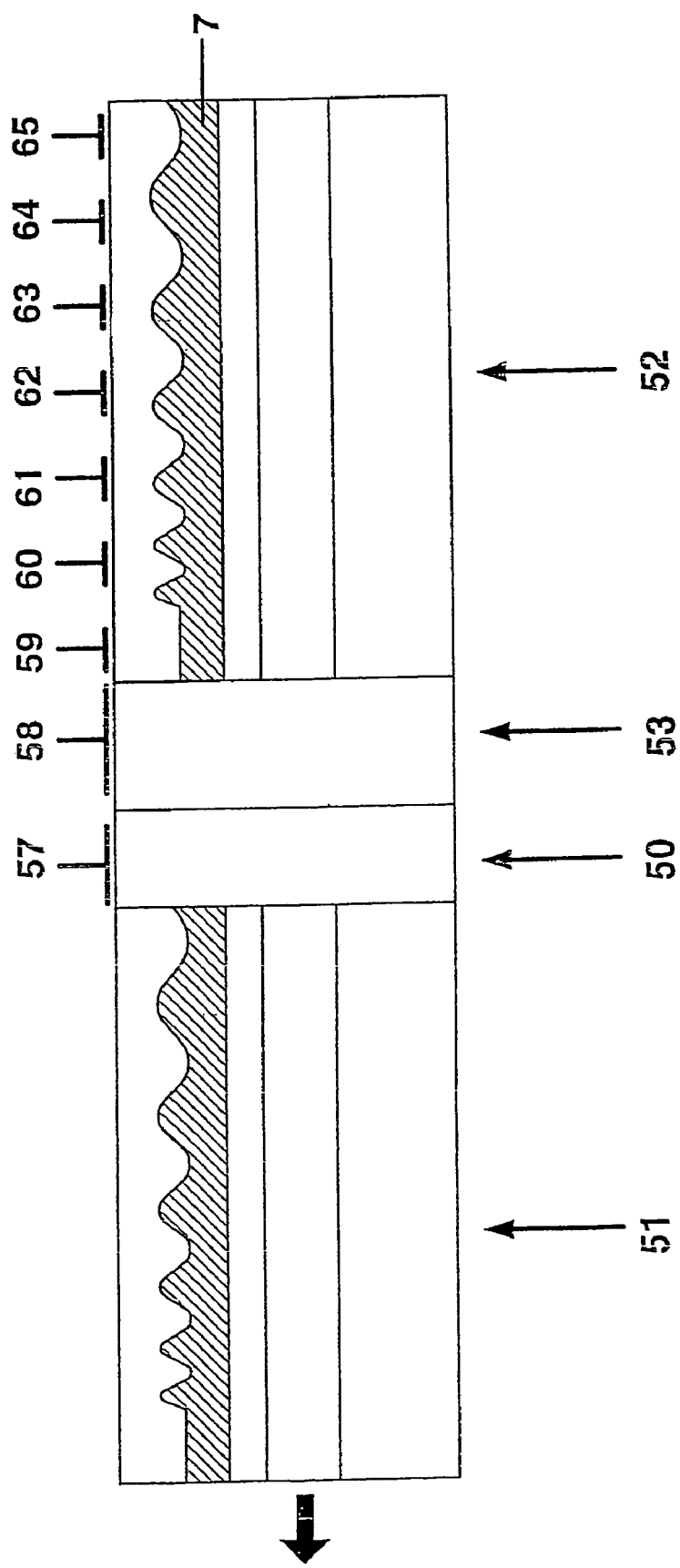
FIG. 9 is a schematic view of a laser in accordance with one aspect of the invention.

FIG. 9 illustrates in cross section the upper portion a laser assembly in accordance with one embodiment of the invention. The laser comprises a four-part assembly of a central gain section 50 with a front mirror in the form of a chirp grating 51 and a rear mirror in the form of a chirp grating 52. There is also a phase change section 53, the function of which will be described below.

Figure 10:
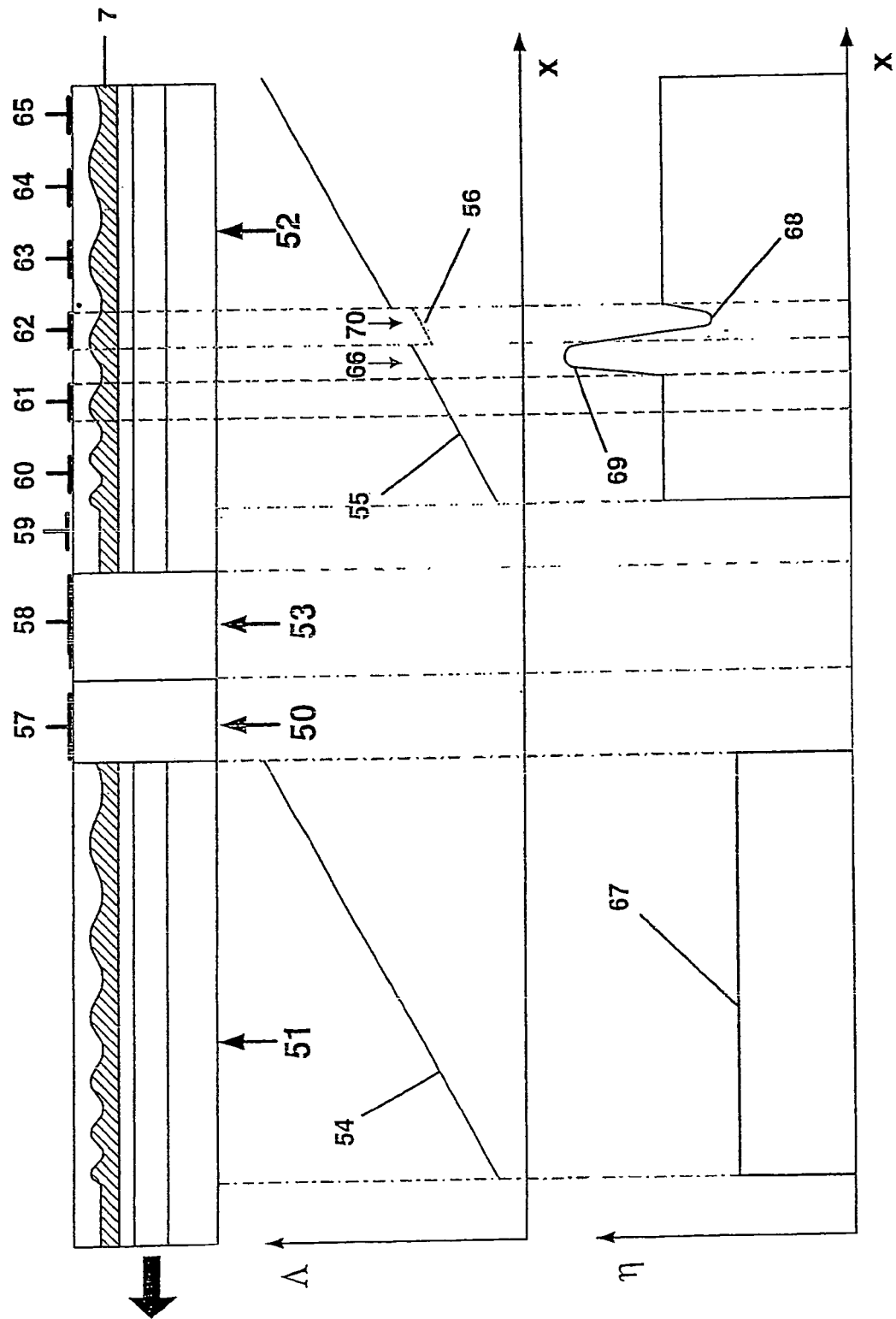
FIG. 10 shows the laser of FIG. 9 with its chirp characteristics and chirp reflectivities.

FIG. 10 is a plot of grating pitch $\Lambda$ against distance x, for an embodiment where the front and rear gratings have identical chirp profiles. This is shown by the traces 54, 55. It will be seen that trace 55 has a region 56, shown dotted below the main portion of the trace, for reasons which will be explained below.

On the outer surface of the laser there are a series of electrodes 57 to 65. The electrode 57 can be used to inject current into the gain section to make it create light. The electrode 58 can be used to control the phase section as described below and the electrodes 59 to 65 are able to inject current into different regions of the rear grating 52.

If just sufficient current is injected into the gain section to make it generate light, then if the chirp sections are capable of reflecting light in the range of 1530 to 1570 nm the wavelengths of light within that range will be internally reflected. Light outside of the reflecting wavelengths will be absorbed or will be emitted from the ends of the laser. The laser will not lase because the intensity of the light at all of the frequencies in the range 1530 to 1570 nm is below the lasing threshold.

To get the laser to lase, it is necessary to have both a population inversion of charge carriers within the gain material and to get at least one, and preferably only one, wavelength to be above the lasing threshold. This is achieved by injecting sufficient current into the gain section 50 through electrode 57 to create the population inversion and by making a portion of the rear grating reflect light of a specific wavelength preferentially, so that the rear grating selectively reflects light of that particular wavelength. The front grating will reflect back the light of that wavelength, so that that wavelength will become the preferred or enhanced wavelength and the laser will commence to lase at that wavelength.

The selection of the particular wavelength is effected by passing a current through an electrode such as electrode 62 above the portion of the chirp grating which corresponds to the region 56 in the trace 55. The effect of the passage of current is to increase the current density in that region of the grating, which lowers the refractive index of the grating layer 7 just below the electrode 62. The lowering of the refractive index has the effect of making the grating reflect at a lower wavelength, which is the same effect as would be obtained by shortening the grating pitches in that region.

This means that the effective grating pitches of the dotted portion 56 as is shown in the central portion of FIG. 10, now line up with the adjacent region 66, forming a chirped Fabry-Perot étalon, which ideally reinforces the reflection in the adjacent region 66.

Figure 11:
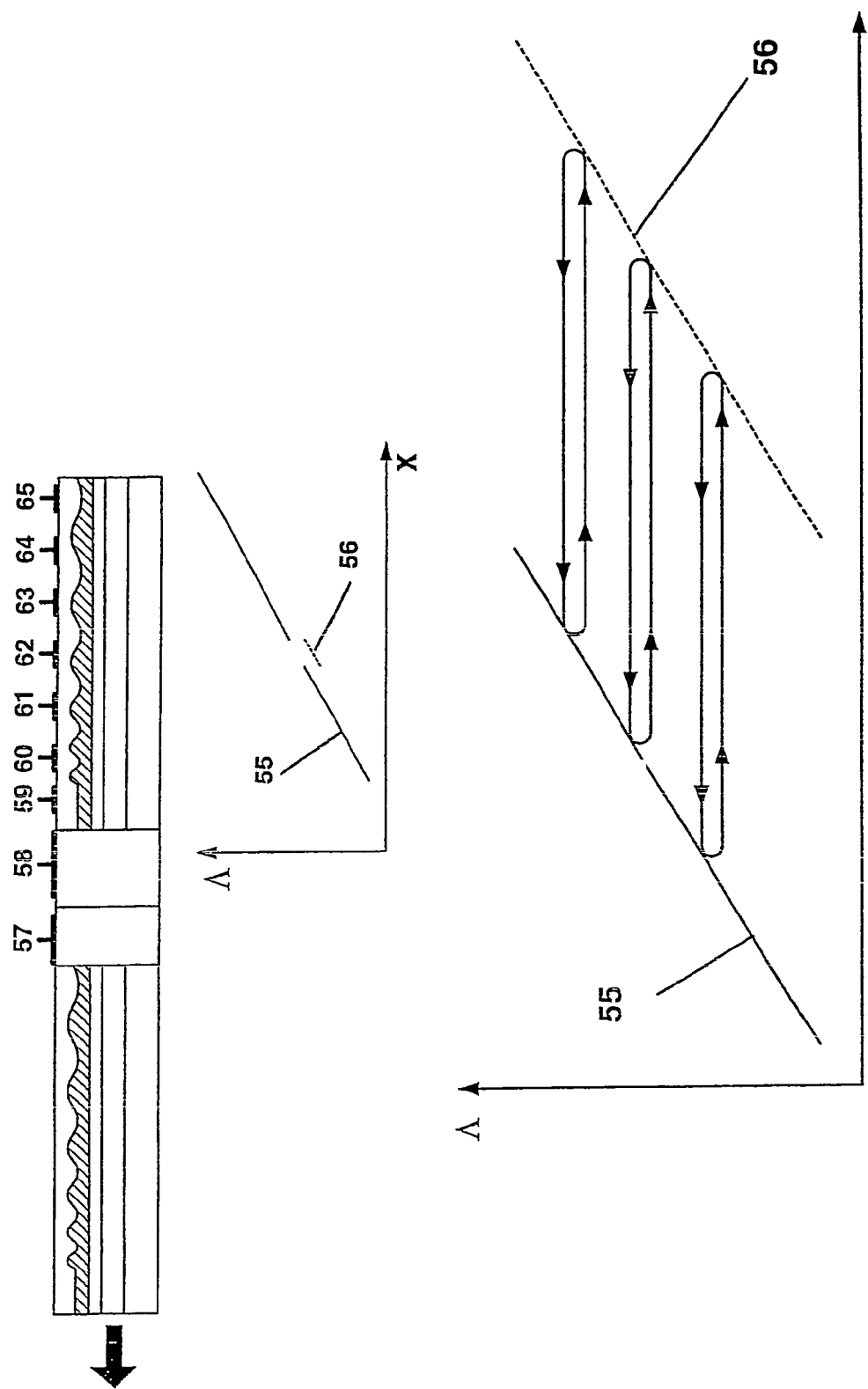
FIG. 11 shows the laser of FIG. 10 with an enlarged view of a portion of the rear chirp characteristics.

Referring to the lowest portion of FIG. 10, which is a graph of reflectivity η vs. distance x, it can be seen that although the reflectivity of the front grating 67 remains flat there is a trough 68 in the reflectivity of the rear grating which corresponds to the region 70 that now reflects at a lower wavelength. However there is now an enhancement of the reflectivity of the region 66 due to the resonant chirped Fabry-Perot étalon structure as shown in FIG. 11. It can be seen that the lines 55 and 56 form a small version of the large parallel arrangement of the chirp diagrams. Thus there is produced a reinforced peak 69 in the reflectivity as seen in FIG. 10.

Light at the wavelength that corresponds to the position of peak 69 is thus selectively reflected and the laser commences to lase at that wavelength.

It will be appreciated that without any further adjustments the laser could only be tuned to as many different wavelengths as there are electrodes 59 to 65.

However, the device can be made continuously tuneable if the materials from which the chirp gratings are constructed have a sufficiently variable refractive index.

Figure 12:
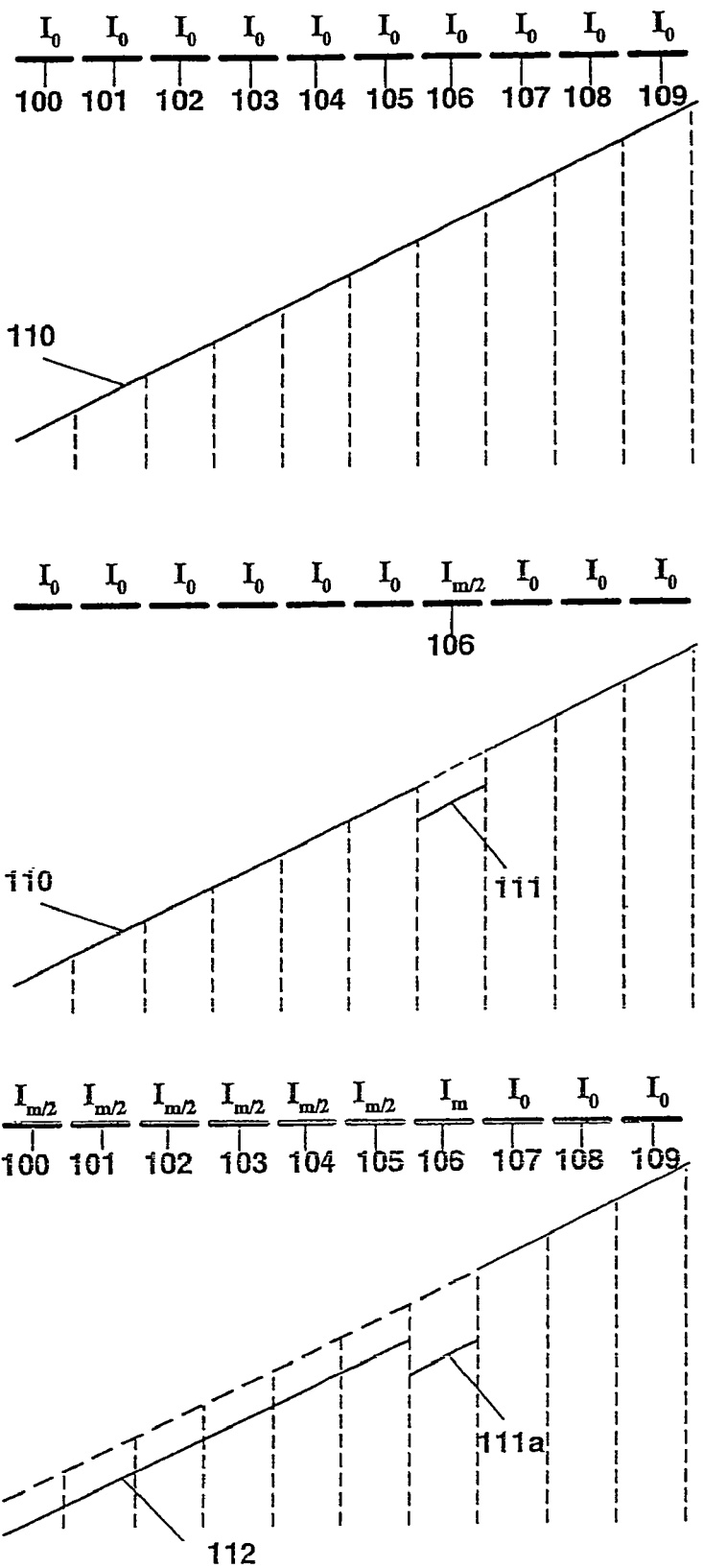
FIGS. 12 and 13 are schematic views of a tuning diagram for a rear mirror.

FIG. 12 illustrates how this can be put into effect. In FIG. 12 there is shown the rear mirror chirp grating under three different conditions.

In the drawing there are shown ten electrode positions 100 to 109, which correspond to the electrode positions 59 to 65 in FIG. 10. In other words, instead of there being seven electrodes over the rear grating, there are ten electrode positions in this schematic. The line 110 corresponds to the line 55 of the rear grating as shown in FIG. 10. The vertical dotted lines show the alignments of the electrodes and the portions of the chirp diagram.

In the upper portion of the FIG. 12 there is no current flowing through any of the electrodes 100 to 109. The line 110 is continuous and the front and rear chirp gratings are in the same state with no portion being preferred.

In the central portion of FIG. 12 a current is passed through electrode 106. The current is half that required to cause the maximum reduction in the refractive index, n, of the material of the chirp grating below the electrode 106, which is equivalent to material 7 in FIG. 10. The result of this is to displace downwards the portion 111 of the line 110. This results in a selection of a particular wavelength at which the laser can lase in exactly the same manner as described above with reference to FIG. 10.

To further tune the laser, so as to reduce the wavelength at which 1 grating is preferred, current is passed through all of electrodes 100 to 105 and at the same time the current passing through electrode 106 is increased. This causes a lowering of the portion 112 of the chirp line below its original position, shown dotted. The portion 111a of the line 110 also is lowered at the same time, thus moving the point of selection to a lower wavelength. In best practise no additional current need be passed through electrodes 107 to 109, as they play no part in the reflecting process. However, since they play no part in the selection process, it is possible for the electrodes 107 to 109 to be lowered in amounts similar to electrodes 100 to 105 without interfering with the wavelength selectivity. When the current passing through the electrode 106 is the maximum which can be applied to reduce n, and thus the maximum amount of fine tuning has occurred, the electrodes 100 to 105 will be passing a current which corresponds to half of the total reduction of n in the material in layer 7 below electrodes 100 to 105.

To further tune the laser, the current is removed from electrode 106 and is applied to the next adjacent electrode (or any other selected electrode) and the sequence of actions is repeated. By this means the laser can be tuned over the entire 1530 nm to 1570 nm waveband.

Figure 13:
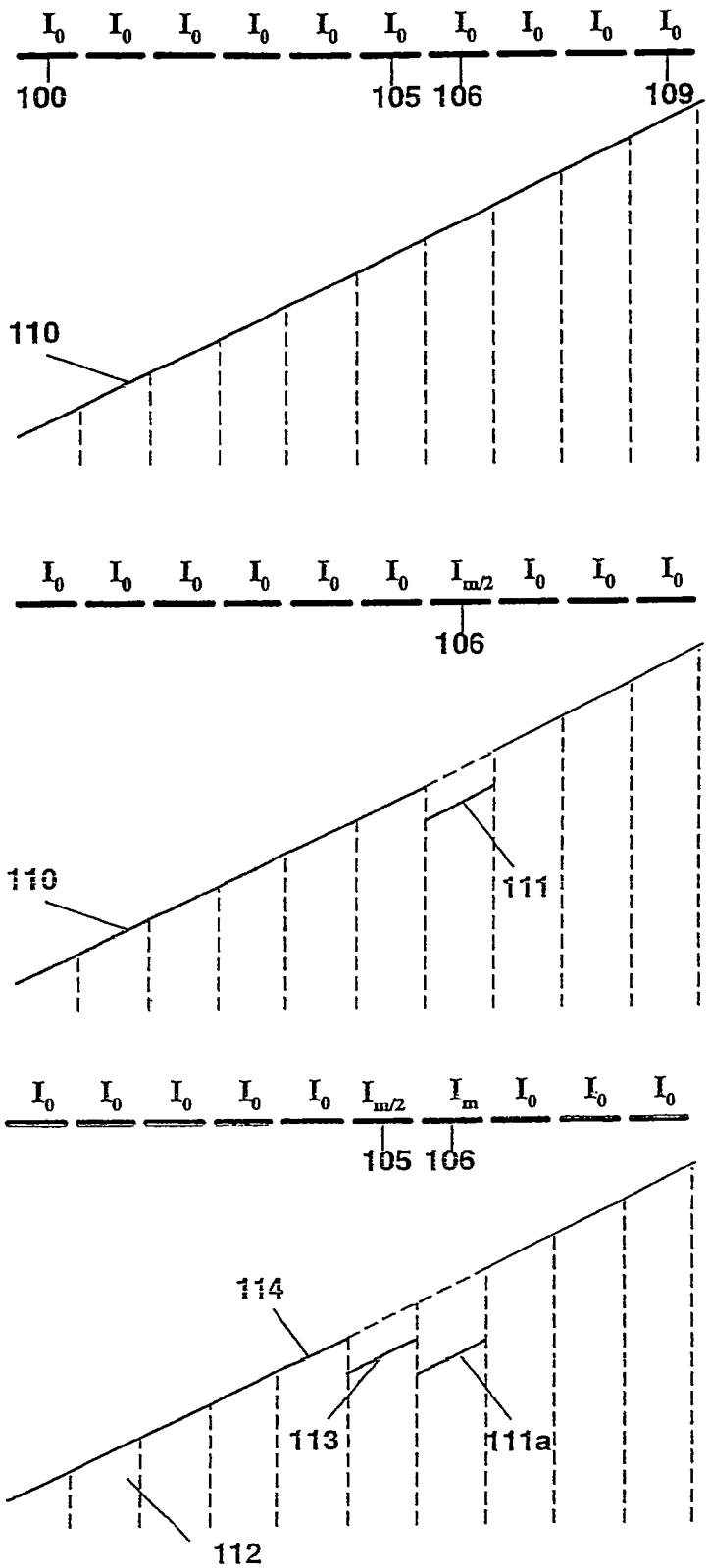

The selectivity of the chirp at a particular wavelength can be enhanced as shown schematically in FIG. 13. This Figure is closely similar to FIG. 12 but shows what happens when two adjacent sections of the chirp grating are moved together.

In the upper portion of FIG. 13 the rear chirp grating is shown in the same position as in FIG. 12. This is also the case for the central portion of FIG. 13, where current applied to electrode 106 has caused a lowering of the line 111 to the position half way down to its maximum extent. If the current is passed through electrode 105 this causes the line 113 to be lowered and the current passing through electrode 106 is increased at the same rate so that lines 111a and 113 move down in synchronism. This means that the grating selectivity is increased by the enhanced reflectivity.

When the applied current to electrode 105 is half of that applied to electrode 106 and the line 111a is depressed to its maximum extent the lines 111a and 113 will also coincide with portion 114 of line 110 to give a three-region coincidence.

When all of the sections have lined up as shown in the lower section of FIG. 13 there is created a clean reflection peak as shown at 115 in the left portion of FIG. 14, which is a graph similar to the lower portion of FIG. 10. However, during the tuning process as 113 and 111a "slide" over 114, a partial second étalon is created causing a perturbation in the primary curve, producing a distorted reflection as shown at 116 in the right hand portion of FIG. 14.

Figure 15:
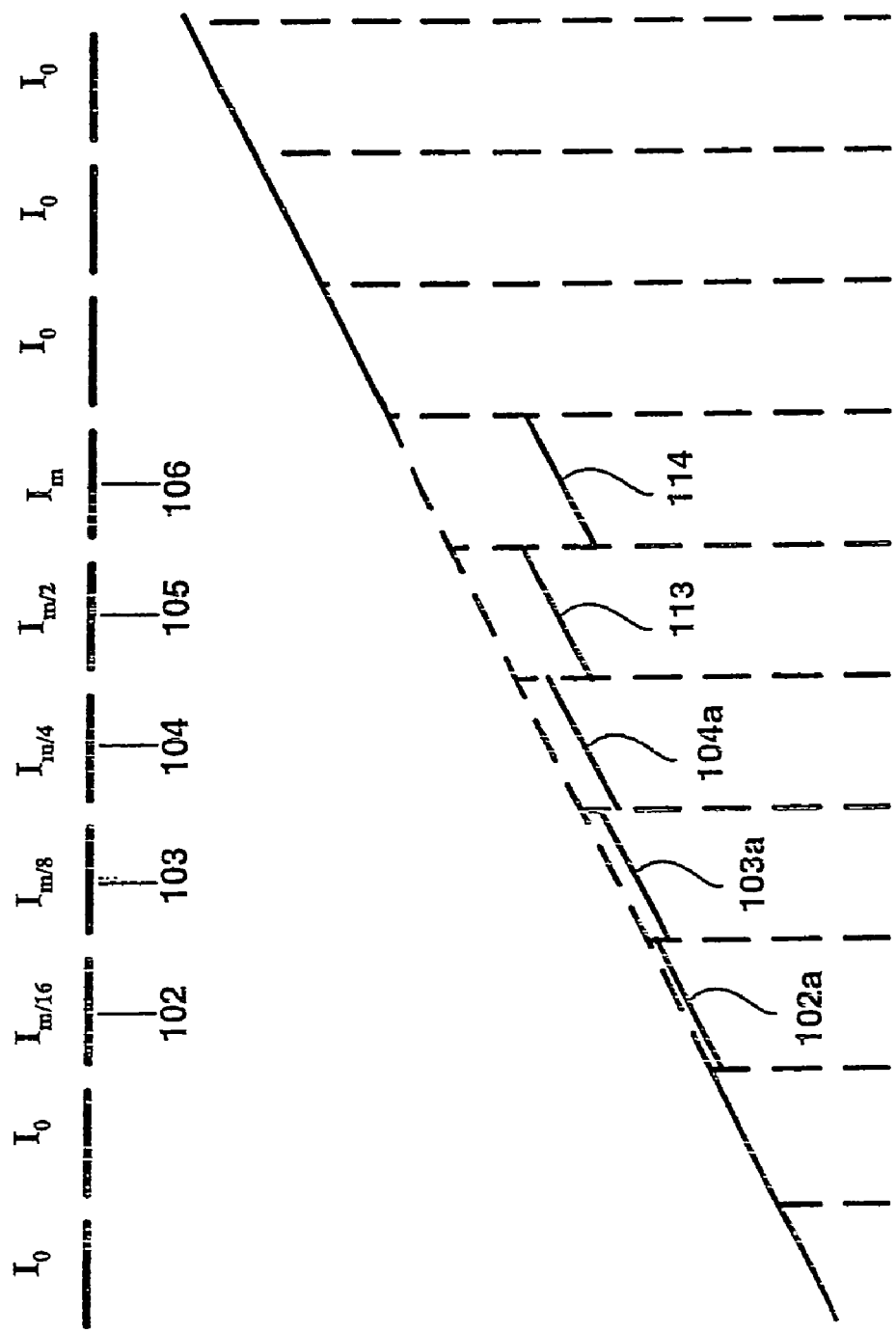
FIG. 15 is a schematic view of the profiled tuning arrangement of the rear mirror.

To prevent this two, three or more electrodes on the lower wavelength side of the wavelength selecting electrodes are lowered as shown in FIG. 15. In this case each of the 104, 103 and 102 electrodes have just sufficient current injection to avoid degradation of the reflection peak. Typically the current in lower wavelength adjacent electrodes will be in excess of half that of the higher wavelength adjacent electrode. For simplicity these profiled currents are referred to as half currents. If the reflection peak is considered to be centrally located at the mid-point of 111a and 113, then the centre of 104a is below this peak and in effect out of the way. By lowering portion 103a by half of the lowering of 104a and so on, there is no substantial reinforcement between sections 104a and 103a. This means that only sections 111a and 113 are in reinforcement and the unwanted perturbations as seen in FIG. 14 on the right, 116, do not occur.

It will be appreciated that the more electrodes that can be installed over the chirp, the greater the number of regions that can be brought into coincidence and the smaller each reduction in refractive index needed at any point to tune the laser. For example, for a range of 40 nm total tuning, if twelve different electrode positions are used, then each is only required to tune through a range of 4 nm, whilst ensuring the desired band coverage is obtained.

By this process, therefore, the laser can be tuned over the whole of the desired wavelength range, depending on the bandwidth of the original gratings.

It will be appreciated that during the coarse tuning the peaks at different wavelengths will always lase by reflecting with the front mirror at exactly the same wavelength, for the reasons set out above. For identical front and rear chirps this would mean that the physical length which the light has to travel would be the same irrespective of whether the laser was lasing at short or long wavelengths. In other words the physical length 28 would be identical to the physical length 29 as shown in FIG. 4.

However, as the refractive index of the material through which the light is traveling varies with wavelength then this would mean that the light lasing at the shorter wavelengths has a different optical cavity length to the light at the longer wavelengths.

What is meant in this specification by a constant optical cavity length is a length in which a constant number of unit standing wave periods can be supported. The number of standing waves, which can be supported within the laser assembly is given by $$N = 2.n.L/\lambda \qquad (2)$$

Where N is the number of standing wave periods, which can be supported, L is the physical cavity length and n is the cavity refractive index.

This means that for identical front and rear chirps the number of standing wave periods varies with the wavelength at which the laser is operating and there will mode hopping. The function of the phase change section 53 controllable by electrode 58 is to give a constant optical cavity length for the embodiment of the invention shown in FIG. 9. The phase change section can also be used to compensate for ageing of the laser. It can also be used to correct small changes occurring as a result of thermal effects.

A number of ways of substantially eliminating or ameliorating the optical cavity length change have been developed. In addition a number of alternative methods of operating the laser to effect optimum performance have also been developed. A way to substantially eliminate the change in the optical cavity length, as the laser is tuned to different wavelengths, is to design and construct the chirp gratings so that as they are written, the chirp characteristics of the front and rear chirps are slightly different, so that the number of standing waves as set out in the above equation (2) is the same irrespective of the wavelength selected. Tuning is thus carried out in a system in which the number of standing waves, N, is constant or as near constant as can be manufactured so that the laser is not prone to mode hopping and little phase control is required. This constitutes optimised chirp gratings for front and rear mirrors.

The shorter the laser the lower the losses there are in the laser, the larger are the longitudinal mode spacings and the easier it is to select the different wavelengths. Thus shortness is a distinct advantage and it has been found that the small amount of phase change needed for the laser of the invention is such that it may be carried out by using the rear mirror as a combined reflector and phase change section. The less current there is injected into the mirror section the lower the waveguide losses introduced. It is for this reason that the preferred embodiment incorporates current profiling across adjacent grating electrodes. Two embodiments of this aspect of the invention are illustrated in FIGS. 16 and 17.

Figure 16:
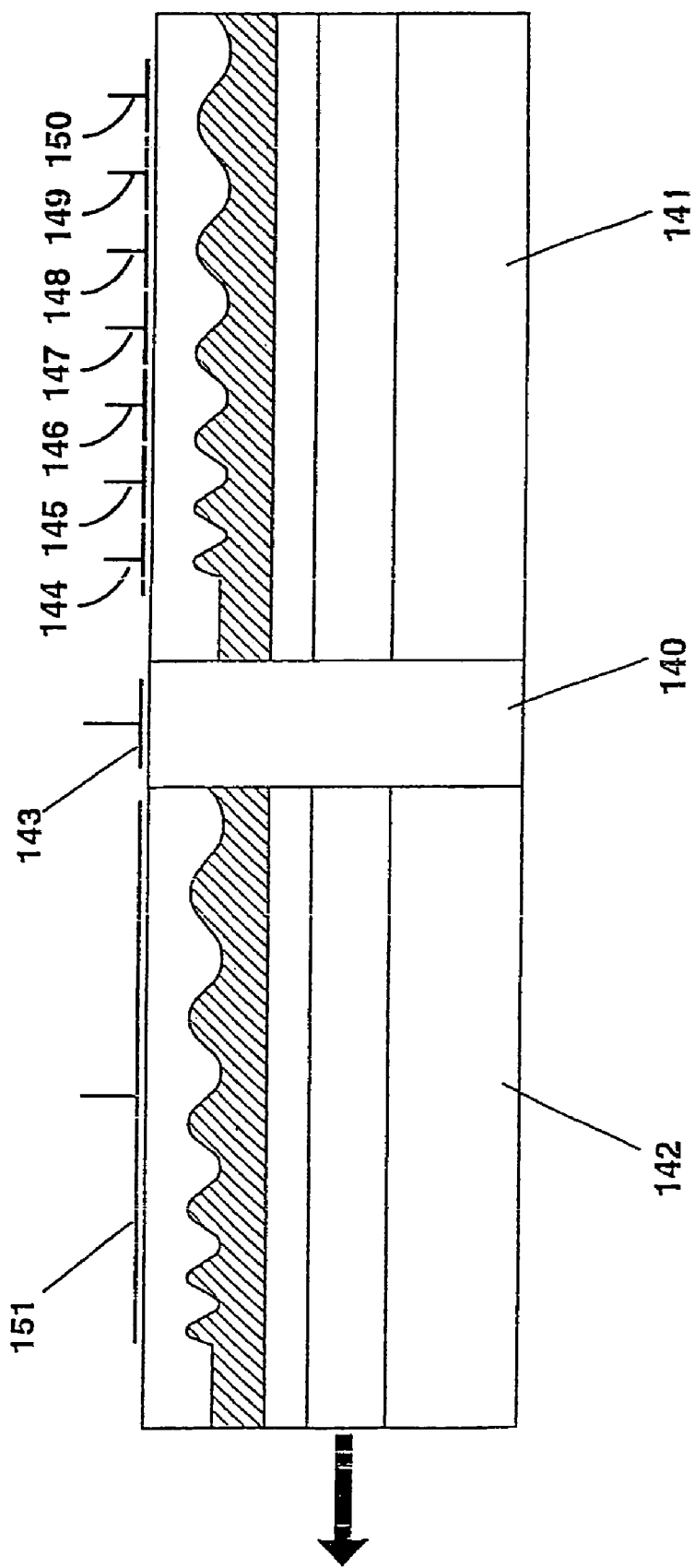
FIGS. 16 and 17 are schematic sectional views of two further embodiments of the invention.
Figure 17:
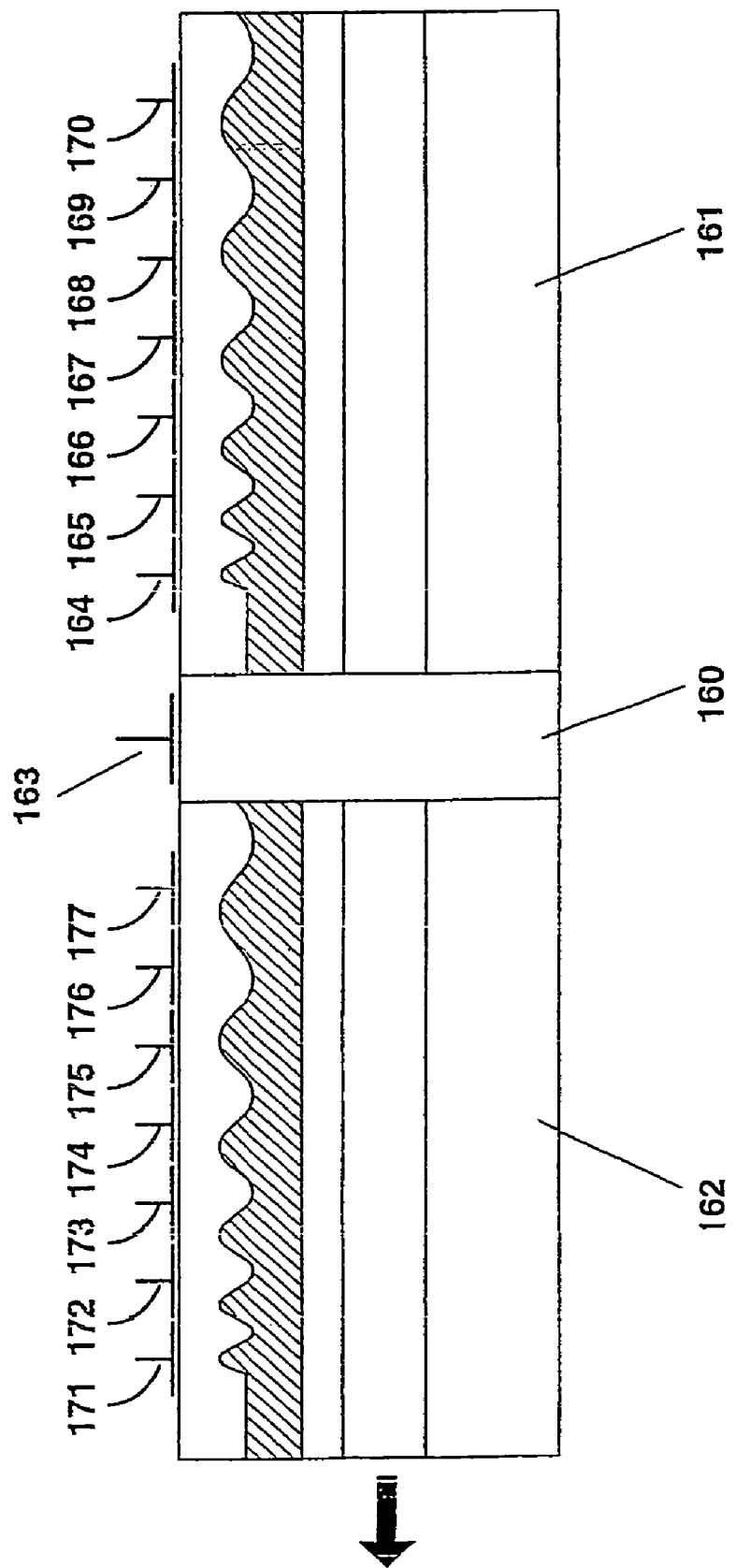

Referring firstly to FIG. 16 this shows a chirped laser assembly in accordance with the invention in which there is provided a central gain section 140 having on one side a rear chirped mirror 141 and on the other side a front chirped mirror 142. The gain section 140 and the rear mirror section 14 are provided With electrodes 143 to 150 which function in the same manner as described above for electrodes 57 and 59 to 65 in FIG. 9. In the laser shown in FIG. 16, there is an electrode 151 over the front mirror which can be used to inject current into the front mirror. This introduces a change of refractive index over the whole of the front mirror so as to cause a variation in the effective optical cavity length. A virtue of this laser design is that it is a mode hop free design brought about without the need to introduce a separate phase control section. The integration of the mirror with a phase control functionality gives advantages of shorter laser cavity length and a reduction in the current induced waveguide losses.

Although the use of a single electrode on the front mirror requires a simple form of current switching there is however, an increased risk of current induced waveguide losses. In the embodiment shown in FIG. 17, the use of segmented electrodes facilitates minimal current induced waveguide losses.

As shown in FIG. 17 there is again a gain section 160 a rear mirror 161 and a front mirror 162. The gain section has an electrode 163 and the rear mirror has electrodes 164 to 170. In the case of this embodiment however, the front mirror 162 has a series of electrodes 171 to 177, which can be individually selected. Any available tuning electrodes within the lasing optical cavity can be utilised as a phase control means to reduce or eliminate mode hoping. The segmented electrode front mirror arrangement is preferably used in combination with the optimised chirp gratings for front and rear mirrors.

Within the scope of the invention there can be embodiments in which the front chirp grating has a single electrode whilst the rear chirp grating has multiple electrodes; embodiments in which the front chirp grating has multiple electrodes and the rear chirp grating has a single electrode; and further embodiments in which both the front and rear chirp gratings have multiple electrodes. In each of these embodiments the strengths of the gratings can be strong or weak in dependence of the laser end from which it is desired to couple out light power.

In the symmetrical design case, wherein both the front and rear chirp gratings are each equipped with multiple gratings, it is possible for the gratings to be of equal strength such that light power may be coupled out from both ends at substantially the same power level. This might be an advantage where the laser is required to feed two different paths, and avoids the need to provide an external power splitting means. It is frequently the case that a laser has light coupled out at both ends but, normally one of these out couplings is low power for monitoring purposes only.

In practice waveguide losses may be balanced by controlling the mark space ratio along the chirp gratings, or by adjusting the chirp profiles of the front and rear mirror in a corresponding manner.

The invention claimed is:

1. A monolithic tuneable laser, comprising:
   a gain section bounded at one end by a first mirror and at the other end by a second mirror,
   wherein each of the mirrors is in the form of a chirp grating,
   wherein at least one of the chirp gratings has a substantially continuous wavelength reflection spectrum and a plurality of selectable electrodes by which one portion of the chirp grating is tuned to reflect substantially the same wavelength as a second portion of the same chirp grating, to thereby selectively adjust the wavelength reflection spectrum of the chirp grating to produce a single distinct enhanced reflection peak at a predetermined wavelength, and
   wherein one of the chirp gratings is a front grating and the other chirp grating is a rear grating, each of the front grating and the rear grating having a pitch characteristic, and the pitch characteristics of the front and rear gratings being such that the optical cavity length of the laser is substantially constant at different wavelengths.

2. The laser according to claim 1, wherein the chirp gratings are located in a material having a refractive index variable in response to the passage of a current there through, and wherein the chirp grating is activated at the predetermined wavelength by the variation in a local region of the refractive index.

3. The laser according to claim 1, wherein a wavelength position of the reflection is altered by varying a refractive index of at least that region of the grating and a portion of the grating between said region and the gain section.

4. The laser according to claim 1, wherein one of the chirp gratings has a plurality of selectable electrodes and the other chirp grating has a single electrode.

5. The laser according to claim 1, wherein the selectable electrodes are located on the rear grating.

6. The laser according to claim 5, wherein the pitch characteristics of the front and rear gratings are substantially identical.

7. The laser according to claim 1, wherein the chirp gratings are linear.

8. The laser according to claim 1, wherein a reflectivity of one of the first and second mirrors is greater than a reflectivity of the other mirror.

9. The laser according to claim 8, wherein the reflectivity of one of the first and second mirrors is of the order of 50% and the reflectivity of the other mirror is of the order of 30%.

10. The laser according to claim 1, wherein the first and second mirrors are formed by electron beam writing of the grating patterns.

11. The laser according to claim 10, wherein a mark space ratio of one of the first and second mirrors is substantially unity and a mark space ratio of the other mirror is different than unity.

12. The laser according to claim 1, wherein pitch spacings of one of the first and second mirrors is lowest adjacent the gain section and the pitch spacings of the other mirror is highest adjacent the gain section.

13. The laser according to claim 1, further comprising a phase change section disposed between the gain section and one of the first and second mirrors.

14. The laser according to claim 1, wherein a composition of the first and second mirrors is formed of Group III-V semiconductor layers of different refractive index.

15. The laser according to claim 1, wherein both of the first and second mirrors have a plurality of electrodes, so as permit both mirrors to be selectively activated to produce a selective reflection at the predetermined wavelength.

16. The tuneable laser accordingly claim 15 wherein at least one of the plurality of electrodes comprises a tuning electrode disposed within an optical cavity, wherein the tuning electrode is employed as a phase controller to reduce or eliminate mode hopping.

17. The tuneable laser according to claim 1, wherein light power is coupled out from both ends of the laser.

18. The tuneable laser according to claim 17, wherein both chirp gratings are substantially identical.

19. A method of operating a laser as claimed in claim 1, comprising the steps of
   selecting a wavelength by passing current through one of the plurality of electrodes to reduce a refractive index of a portion of the chirp grating affected by the electrode, and
   actuating one or more electrodes of said plurality of electrodes capable of reducing the refractive index of the portion of the chirp grating effective at a shorter wavelength to prevent the formation of a distorted reflection peak.

* * * * *